United States Patent [19]

Omata et al.

[11] Patent Number: 4,550,258
[45] Date of Patent: Oct. 29, 1985

[54] APERTURE STRUCTURE FOR CHARGED BEAM EXPOSURE

[75] Inventors: Fujio Omata, Hachioji; Kiichi Takamoto, Tokorozawa, both of Japan

[73] Assignee: Nippon Telegraph & Telephone Public Corporation, Tokyo, Japan

[21] Appl. No.: 515,304

[22] Filed: Jul. 19, 1983

[30] Foreign Application Priority Data

Jul. 27, 1982 [JP] Japan .................................. 57-130616
Feb. 1, 1983 [JP] Japan .................................... 58-15146

[51] Int. Cl.$^4$ .............................................. H01J 37/00
[52] U.S. Cl. .............................. 260/505.1; 250/396 R; 250/492.2
[58] Field of Search ............................ 313/361.1, 363; 250/505.1, 492.2, 492.3, 396 R, 398, 311; 315/382

[56] References Cited

U.S. PATENT DOCUMENTS

| 3,736,425 | 5/1973 | Chernow | 250/492.2 |
| 3,911,281 | 10/1975 | Ihme | 250/492.2 |
| 4,053,808 | 10/1977 | Peacock | 250/505.1 |
| 4,220,866 | 9/1980 | Taumann et al. | 250/505.1 |
| 4,258,265 | 3/1981 | Sami | 250/396 R |
| 4,263,514 | 4/1981 | Reeds, Jr. | 250/492.2 |

Primary Examiner—Bruce C. Anderson
Attorney, Agent, or Firm—Frishauf, Holtz, Goodman & Woodward

[57] ABSTRACT

In an aperture for a charged particle beam exposure apparatus, the outside edges of fine wires are located inside the individual sides of an opening formed in a conductive sheet so that an opening smaller than the opening of the conductive sheet is defined by the fine wires.

28 Claims, 14 Drawing Figures

APERTURE STRUCTURE FOR CHARGED BEAM EXPOSURE

BACKGROUND OF THE INVENTION

This invention relates to an aperture structure for a charged particle beam exposure apparatus, capable of forming a shaped beam of high-accuracy shape and size.

In apertures for charged beam exposure apparatuses, as is generally known, an electrically conductive sheet having a small square opening is set on the optical axis of the optical system of the charged beam exposure apparatus, whereby part of a charged beam emitted from a charged particle source is intercepted as the beam passes through the square opening so that a square image of the beam is formed.

In a conventional aperture for a charged beam exposure apparatus, such as the one disclosed in U.S. Pat. No. 4,263,514, four sheets each having a knife edge on one side are combined so that their respective knife edges intersect at right angles to one another to define a square aperture. In this example, the corners of the square aperture have no roundness. This aperture, however, is subject to the following drawbacks. In order to form a high-orthogonality square opening by combining four sheets, it is essential that the sheets not be dislocated during assembly work. However, the sheets are prone to dislocation as they are adhered to one another. Moreover, the knife edges, which are formed by grinding, are prone to errors in linearity. Thus, it is hard to obtain high-accuracy square apertures. When using such a conventional aperture structure in a charged beam exposure apparatus which can provide charged beams of various shapes, it is necessary to select one or two corners of relatively high orthogonality.

SUMMARY OF THE INVENTION

The object of this invention is to provide an aperture structure for a charged beam apparatus which can provide a shaped beam of a highly accurate size and which is free of the aforementioned drawbacks of the prior art aperture structure.

In order to attain the above object, an aperture structure for a charged particle beam exposure apparatus according to the invention comprises an electrically sheet having an opening which has straight edges, and fine wires whose side edges are individually located inside at least two adjacent sides of the opening of the conductive sheet, the fine wires defining an aperture smaller than the opening of the conductive sheet.

In the aperture structure according to the invention, constructed in this manner, a shaped beam of a highly accurate shape can be formed by means of high-linearity fine wires. It is therefore possible to eliminate geometrical errors of a pattern formed on the surface of a target that are attributed to errors in the orthogonality and parallelism of the opening and ruggedness of the edges of the opening. Thus, a pattern of high quality may be obtained.

According to the aperture structure of the invention, moreover, an opening is formed by making two parallel sections of a fine wire intersect those of another fine wire at right angles, the parallel sections of each fine wire being formed by stretching the fine wire between pins arranged on the base in accordance with the diameters and locations of the pins. Thus, the aperture structure can easily be formed without working errors or dislocation of the square opening.

DETAILED DESCRIPTION OF THE PREFERRED EMBODIMENTS

One embodiment of this invention will now be described in detail with reference to the accompanying drawings.

Figure 1:
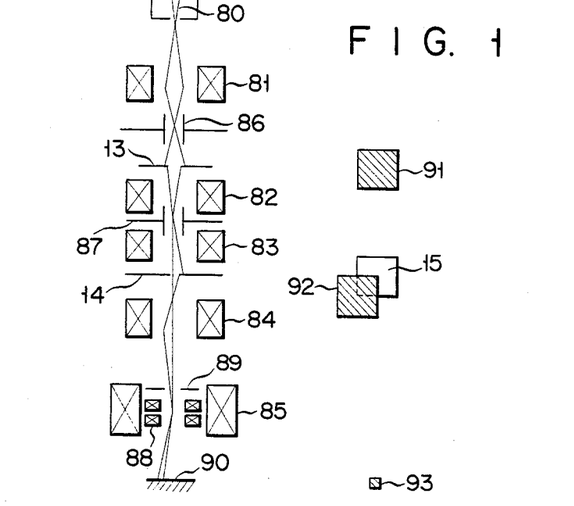
FIG. 1 shows an example of an electron optical system of an exposure apparatus using aperture structures.

FIG. 1 shows an example of an electron optical system of an exposure apparatus using aperture structures for for forming charged particle beams of various shapes. In FIG. 1, numeral 80 designates an electron gun; 81, a condenser lens; 82 and 83, beam shaping lenses; 84, a demagnification lens; 85, a projection lens; 86, blanking plates; 87, a beam shaping deflector; 88, a beam deflector; 89, a beam limiting aperture; 90, the surface of a target; 13, a first aperture structure; 14, a second aperture structure; 91, a square electron beam in section shaped by the first aperture structure 13; 15, a square opening of the second aperture structure 14; 92, an image of the electron beam shaped by the first aperture structure 13 and projected on the second aperture structure 14 in a deflected manner; and 93, an image of the electron beam projected on the surface of the target 90. (Needless to say, the present invention may also be applied to an exposure apparatus which provides a charged beam of a fixed shape.) In this electron optical system, a crossover image of an electron beam emitted from the electron gun 80 and a square electron beam image made by an aperture structure are projected in a prescribed condition. The shaped beam is deflected by the beam shaping deflector 87 at the same time that an image of the electron beam 91 shaped square by the first aperture structure 13 is projected on the second aperture structure 14 through the beam-shaping lenses 82 and 83. While passing through the square opening 15 of the second aperture structure 14, the deflected beam 92 is formed into the prescribed shape (square) and size. The beam shaped in this manner is projected on the surface of the target 90 through the demagnification lens 84 and the projection lens 85, forming a demagnified image with prescribed dimension.

Figure 2:
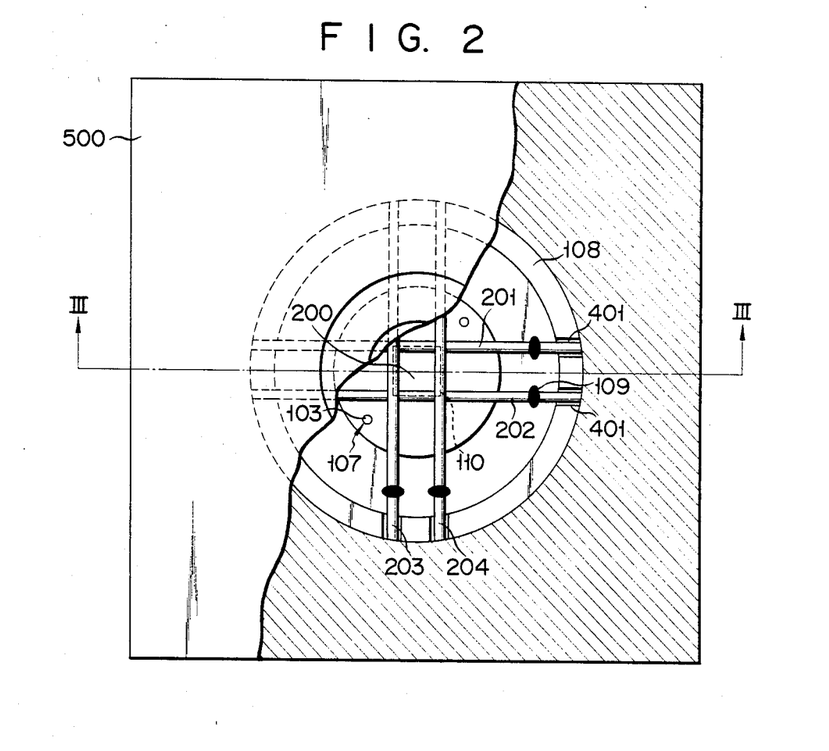
FIG. 2 is a cut away plan view for illustrating the formation of an aperture structure for a charged particle beam exposure apparatus according to this invention.
Figure 3:
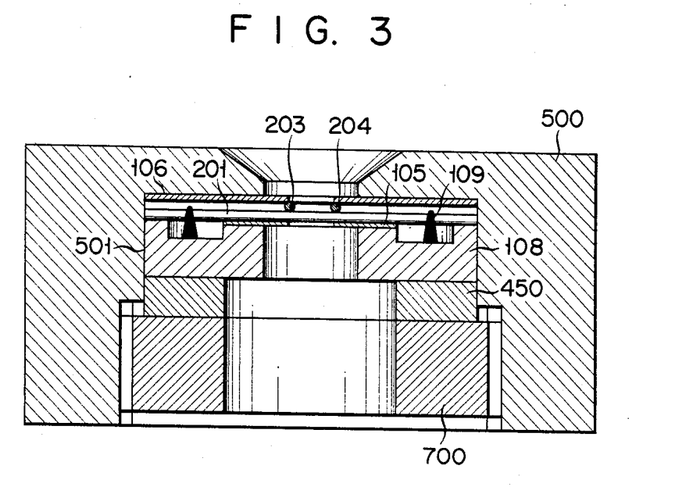
FIG. 3 is a sectional view taken along line III—III of FIG. 2.

FIGS. 2 and 3 show the construction of one embodiment of the aperture of this invention. In FIGS. 2 and 3, fine gold wires 201, 202, 203 and 204 are cylindrical and have a smooth surface with roughness of 0.1 micron or less. The roughness of the edges of a resultant pattern is 0.01 micron or less in an electron optical system with a demagnification factor of 1/10 to 1/20, so that it constitutes no hindrance to the pattern formation. Thus, edges of high linearity can be obtained by stretching the fine gold wires under tension. A square opening 200 is formed by arranging the four fine gold wires 201, 202, 203 and 204 in parallel crosses under tension. The orthogonality of the square opening 200, that is, the orthogonality or parallelism between the fine gold wires 201 to 204, depends on the accuracy of the assembly of the fine gold wires.

In assembling the fine gold wires 201 to 204, positioning grooves 401 are formed on the outer periphery of a mount 108 at intervals agreeing with the size of the square opening 200 to be formed, with high positional accuracy for high orthogonality and parallelism of the square opening 200.

Using the grooves 401 as guide means, the fine gold wires 201 to 204 are stretched tight from each side. Then, the relative positions of the four fine gold wires 201 to 204 are measured by means of a microscope. When the prescribed orthogonality and parallelism are obtained, both ends of each fine gold wire are fixed to the mount 108 by spot welding or silver soldering. Numeral 109 designates welds. According to this method of assembly, the fine gold wires can be stretched with linearity accuracy of ±5 microns for an interval of 5 mm, with orthogonality of 90°±3.4'. Thus, the parallelism between the fine gold wires is approximately ±0.2 micron for a square with an area of 200 microns square. Considering the demagnification factor of the electron optical system, this parallelism is acceptable. Due to the linearity and orthogonality of the fine gold wires, the corners of the square opening 200 have no roundness at all.

In FIG. 3, numeral 105 designates a molybdenum sheet for intercepting that portion of a beam which is applied to the area other than the square opening 200 defined by the fine gold wires 201 to 204. The molybdenum sheet 105 has a square opening 110 (as shown in FIG. 2) which is a little wider than the square opening 200. The molybdenum sheet 105 is fixed to the mount 108 before the assembly of the fine gold wires 201 to 204. The molybdenum sheet 105 is positioned through the engagement of knock pins 103 (as shown in FIG. 2) on the mount 108 and positioning holes 107 (as shown in FIG. 2) in the molybdenum sheet 105. Numeral 106 designates a molybdenum sheet similar to the sheet 105. The molybdenum sheet 106 is interposed between the fine gold wires 203, 204 and a fixed base 500 for setting the mount 108. The molybdenum sheet 106, which serves to protect the fine gold wires 201 to 204, is positioned in the same manner as the molybdenum sheet 105, using the same knock pins 103.

Thus, in this embodiment, the fine gold wires 201 to 204 are sandwiched between the molybdenum sheets 105 and 106 on both lower and upper sides of the wires. On the other hand, the molybdenum sheet may be provided on only one side of the fine gold wires. In setting the mount 108 in the fixed base 500, the mount 108 is first inserted into a socket 501 of the fixed base 500, and a presser ring 450 is then fitted into the socket 501. Finally, a clamp screw 700 is attached to the fixed base 500 to clamp and fix the mount 108. The whole assembly including the fixed base 500 is attached to the aperture position in the electron optical system. The difference in level between the square edges, which is attributed to the thickness of the fine gold wires 201 to 204 arranged in parallel crosses, constitutes no hindrance to the beam formation.

Thus, in attaching the mount 108 to the electron optical system to form a shaped beam for pattern drawing, if the demagnification factor of the electron optical system is 1/20, then the roughness of the edges of a resultant pattern is 0.01 micron or less, the corners of the pattern have no roundness, and the parallelism of the sides of the square is ±0.02 micron or less. In this manner, a shaped beam with high geometrical accuracy can be formed.

Considering the strength, the fine gold wires defining the square require a diameter of at least 20 microns or thereabouts. However, the aperture can be formed by the use of tungsten wire or glass fiber with a diameter of over 10 microns. The glass fiber is covered with gold for electrical conduction.

The assembly accuracy of the fine gold wires can be improved by stretching them tight and providing a positioning tool for preventing dislocation of the fine gold wires at the time of fixation thereof.

Figure 4:
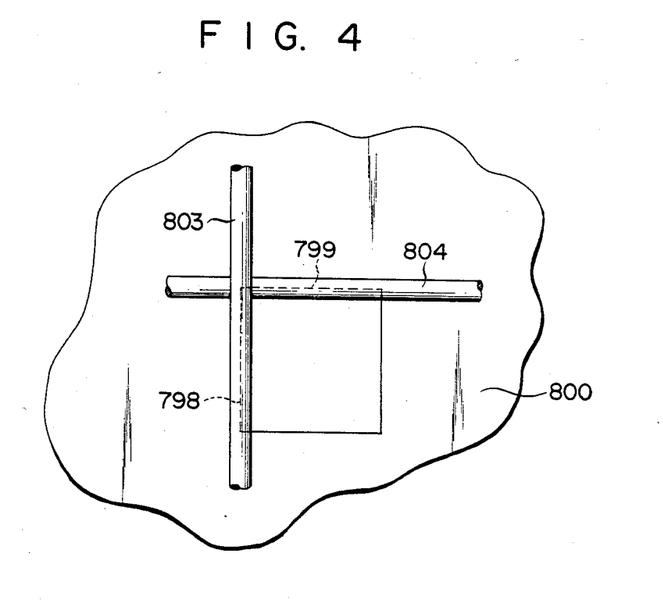
FIG. 4 shows an embodiment of the aperture structure of the invention, in which two perpendicularly intersecting fine gold wires are arranged individually on two sides of a square opening.

In the embodiment described above, the fine gold wires are arranged in parallel crosses. Alternatively, however, as shown in FIG. 4 two fine gold wires 803 and 804 may be arranged on two perpendicularly intersecting sides 798 and 799, respectively, of an opening in a metal sheet 800. Also, the fine gold wires may be arranged on three sides or on two parallel sides of the opening. It is to be understood that metal sheets each having a square opening may be disposed on both upper and lower sides of the fine gold wires.

Another embodiment of this invention will now be described in detail.

Figure 5:
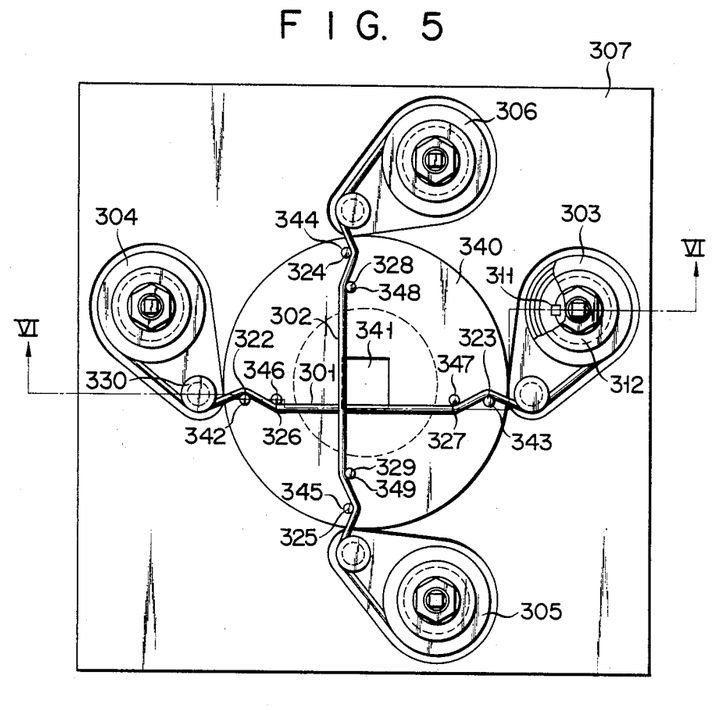
FIG. 5 is a plan view showing another embodiment of the aperture structure of the invention, in which fine gold wires defining two sides of the aperture structure can be shifted by a winder mechanism.
Figure 6:
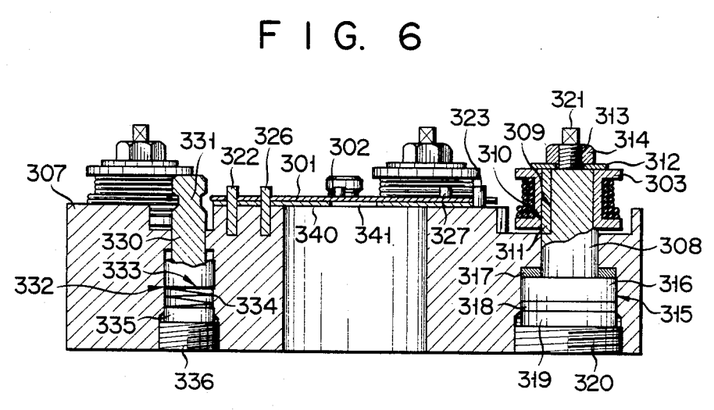
FIG. 6 is a sectional view taken along line VI—VI of FIG. 5.

In FIGS. 5 and 6, numerals 301 and 302 designate fine gold wires, which are wound around bobbins 303, 304, 305 and 306 constituting a winder mechanism. Thus, those portions of the fine gold wires 301 and 302 contaminated by electron beams can be transferred so that a right-angled portion is defined by newly fed portions of the fine gold wires. As shown in FIG. 5, the ends of the fine gold wire 301 are fixed individually to the bobbins 303 and 304, while those of the fine gold wire 302 are fixed individually to the bobbins 305 and 306.

As shown in FIG. 6, each bobbin wound with the fine gold wire is mounted on a rotating shaft 308 set on a fixed base 307 which constitutes an aperture structure. By way of example, the way the bobbin 303 is mounted will be described. The bobbin 303 is fitted on the rotating shaft 308 so that a keyway 309 of the rotating shaft 308 is in alignment with a keyway 310 of the bobbin 303. Then, a key 311 which transmits the turning motion of the rotating shaft 308 is fitted in the joined keyways 309 and 310 of the rotating shaft 308 and the bobbin 303 connected together. Thereafter, a bobbin presser washer 312 is put on the bobbin 303, and a bobbin clamping nut 314 is screwed on a screw portion 313 of the rotating shaft 308. Thus, the bobbin 303 is fixed. The rotating shaft 308 can rotate in both forward and reverse directions so that the fine gold wires can be wound and rewound. The bearing portion of the rotating shaft 308 is formed of a shaft hole 315 in the fixed base 307 and a cylindrical portion 316 of the rotating shaft 308. Numerals 317 and 318 designate sliding members for smoothing the rotation of the rotating shaft 308. Numeral 319 designates a presser ring for uniformly transmitting the clamping force of a clamp screw 320. The clamp screw 320 fixes the bearing portion, and gives a thrust to the bearing portion. The thrust serves as a braking force on the bearing portion, whereby the stretched fine gold wires are prevented from slackening. Four such rotating shafts 308 are arranged at four positions on the fixed base 307. The bobbins 303 to 306 are mounted on their corresponding rotating shafts 308 in the same manner. The rotating shafts 308 are rotated by means of their respective rotating keys 321.

In assembling the fine gold wires 301 and 302, positioning pins 322 to 329 are first arranged on the fixed base 307. The positioning pins 322, 326, 327 and 323 are arranged accurately in a straight line. Likewise, the positioning pins 324, 328, 329 and 325 are arranged accurately in a straight line intersecting the arrangement line of the pins 322, 326, 327 and 323 at right angles. Thus, the two fine gold wires 301 and 302 stretched along these positioning pins as guide means intersect each other at right angles. Idle shafts 330 are disposed individually between the positioning pins 322 to 325 and their corresponding rotating shafts 308. Thus, tension is applied to the stretched fine gold wires to prevent their dislocation and to adjust the height thereof. Each idle shaft 330 has a positioning groove 331 on the head portion for guiding the fine gold wire. The idle shaft 330 is set in a shaft hole 332 in the fixed base 307 so as to be movable in the vertical direction as shown in FIG. 6. A buffer 334 is disposed under the lower end face 333 of the idle shaft 330 in the shaft hole 332. Numeral 335 designates a presser ring for uniformly transmitting the force of a clamp screw 336 for buffer adjustment. The fine gold wires 301 and 302 are respectively stretched in a zigzag manner between each idle shaft and its adjoining two positioning pins so that the orthogonality and linearity of the fine gold wires 301 and 302 are maintained. For example, the fine gold wire 301 meanders through the positioning pins 326 and 322 and the idle shaft 330.

Wound around the one pair of bobbins 303 and 304 and the other pair of bobbins 305 and 306, respectively, the fine gold wires 301 and 302 stretched at right angles can be strained by rotating each facing pair of rotating shafts 308 in opposite directions.

In the assembly of the fine gold wires 301 and 302, the wires can be stretched with linear accuracy of ±10 microns for an interval of 5 mm. In this case, the orthogonality is 90°±6'. Thus, if the demagnification factor of the electron optical system is 1/10 to 1/20, a square beam with a sectional area of 100 microns square shaped by the first and second aperture structures 13 and 14 is projected on the surface of the target 90 as a square beam image with an area of 10 to 5 microns square and parallelism of ±0.04 micron or less. This indicates the existence of no influence on the geometrical accuracy of the beam.

In this embodiment, the difference in level produced when the fine gold wires 301 and 302 are assembled at right angles constitutes no hindrance to the beam formation.

In FIG. 5, numeral 340 designates a molybdenum sheet for intercepting that portion of an electron beam which is applied to the other area than the right-angled portion defined by the fine gold wires 301 and 302. The molybdenum sheet 340 has a square opening 341. The molybdenum sheet 340 is positioned and fixed so that two adjacent sides of the square opening 341 defining a right-angled corner are hidden individually behind the two fine gold wires 301 and 302. The positioning is achieved by the use of the positioning pins 322 to 329 for guiding the fine gold wires 301 and 302. Therefore, the molybdenum sheet 340 is provided with positioning holes 342 to 349.

Figure 7:
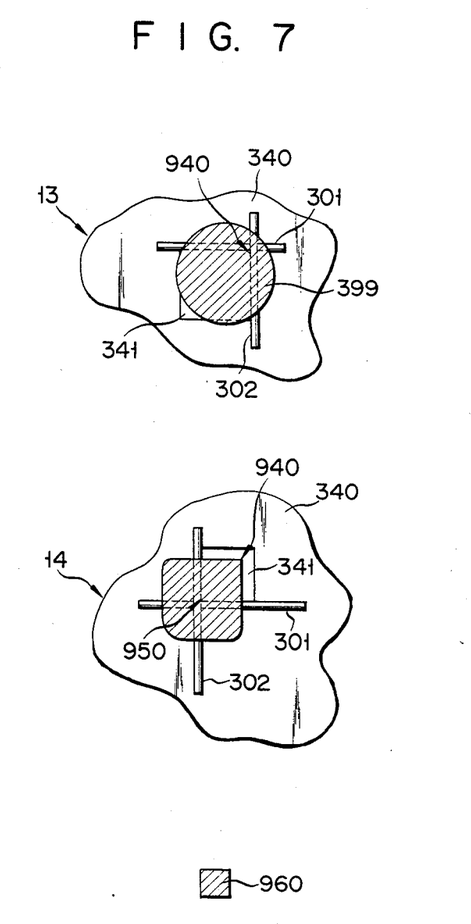
FIG. 7 is a diagram for illustrating how to shape a square charged beam by the use of the aperture structure of the invention.

FIG. 7 shows a method for shaping a beam using the aperture structures 13 and 14 of the electron optical system arranged as shown in FIG. 1. First, a section of an electron beam 399 emitted from the electron gun 80 is cut by that corner of the first aperture structure 13 defined by the fine gold wires 301 and 302 to form a right-angled corner 940 constituting part of a square beam. An image of the electron beam shaped by the first aperture structure 13 is projected on the second aperture structure 14 in a deflected manner through the beam shaping lenses 82 and 83 and the beam shaping deflector 87. At this time, a section of the shaped electron beam is cut by the second aperture structure 14 on that side which is not shaped by the fine gold wires 301 and 302 of the first aperture structure 13, thereby shaping a beam having a right-angled corner 950. In doing this, the corner 940 of the electron beam image defined by the fine gold wires 301 and 302 of the first aperture structure 13 is located diagonally opposite to that corner 950 shaped by the fine gold wires 301 and 302 of the second aperture structure 14. Numeral 960 designates an image of the electron beam thus shaped and projected on the surface of the target 90 through the demagnification lens 84 and the projection lens 85.

If the working portions of the fine gold wires 301 and 302 are contaminated, they are transferred so that newly fed portions of the wires are set in position to form the right-angled portion for the beam shaping. In doing this, a handle (not shown) for rotating the rotating shafts 308 is inserted through an opening provided in the fixed base 307, without removing the fixed base 307 from the electron optical system, and is turned to rotate the rotating shafts 308, thereby transferring the fine gold wires. In rotating the rotating shaft 308 by the handle, the rotating key 321 of the rotating shaft 308 is fitted in a keyhole of the handle. In transferring one of the fine gold wires, the rotating shaft of the bobbin on the supply side is first rotated to loosen the fine gold wire. Then, the rotating shaft of the bobbin on the take-up side is rotated to transfer the fine gold wire. After the transfer of the fine gold wire, the two rotating shafts are rotated in opposite directions to tighten the fine gold wire.

According to the embodiment described above, fine gold wires of high linearity are assembled with high accuracy to form two perpendicularly intersecting sides of an aperture structure for shaping a beam. Therefore, the corners of the shaped beam have no roundness, the roughness of the edges of the shaped beam is 0.01 micron or less, and the parallelism of the sides of the shaped beam is ±0.04 micron or less, ensuring high shaping accuracy. Thus, a high-quality pattern may be obtained. Since the assembled fine gold wires can be wound and rewound, the aperture structure can easily be renewed by only transferring the fine gold wires defining the right-angled portion, without changing the alignment conditions of the electron optical system for the beam shaping. Thus, the maintenance and adjustment of the electron optical system are facilitated.

If a Faraday cage for measuring electron beam current is set under the intersecting fine gold wires, the aperture structure of this invention can be applied to a beam size measuring device of a sharp-edge system which applies a beam for deflection scanning at right angles to the fine gold wires, and measures changes of the beam current value when the beam crosses the fine gold wires. Also, the fine gold wires forming above the Faraday cage can be renewed by only transferring the contaminated portions thereof. Accordingly, it is unnecessary to take out the measuring device from the electron beam exposure apparatus in changing the fine gold wires. Thus, it is unnecessary to align the perpendicularly intersecting axes of the two fine gold wires after the renewal with the laser coordinate axis of the electron beam exposure apparatus, or with the two-dimensional directions (X and Y directions) of beam deflection. In consequence, the maintenance and adjustment are facilitated.

In the embodiment described above, the two fine gold wires are arranged at right angles. Alternatively, however, the fine gold wires may be arranged in parallel crosses on the four sides of the square opening in the molybdenum sheet. Also, the wires may be arranged on three sides of the square opening. Although fine gold wires are used in this embodiment, as in the foregoing embodiment, they may be replaced with tungsten wires that are superior in strength.

In the above embodiment, moreover, the molybdenum sheet 340 is disposed under the fine gold wires. However, the molybdenum sheet or sheets may be disposed over or on both sides of the wires.

Figure 8:
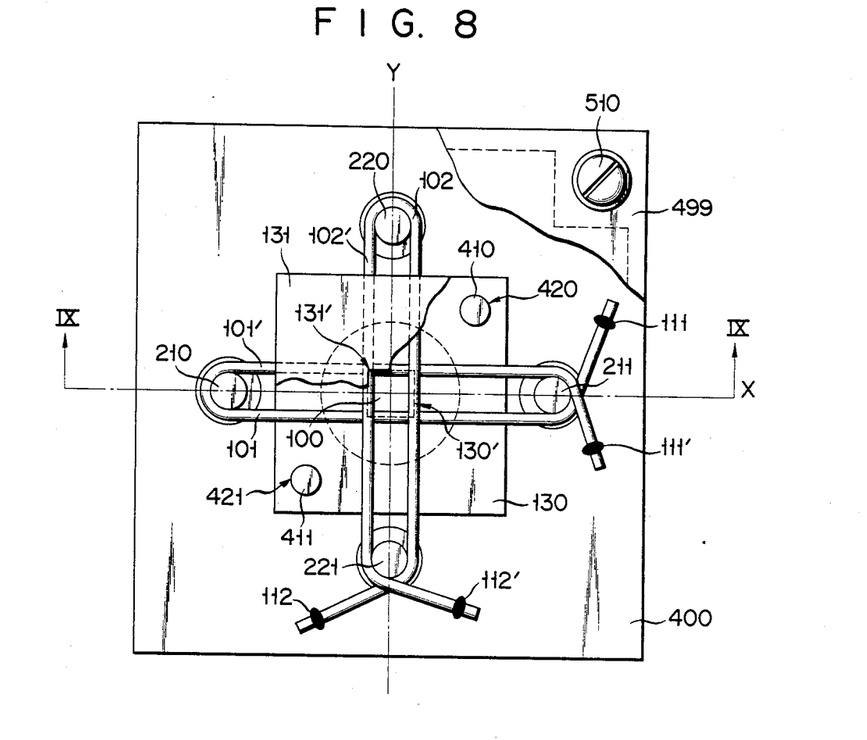
FIG. 8 is a plan view of means for forming an aperture structure according to the invention.
Figure 9:
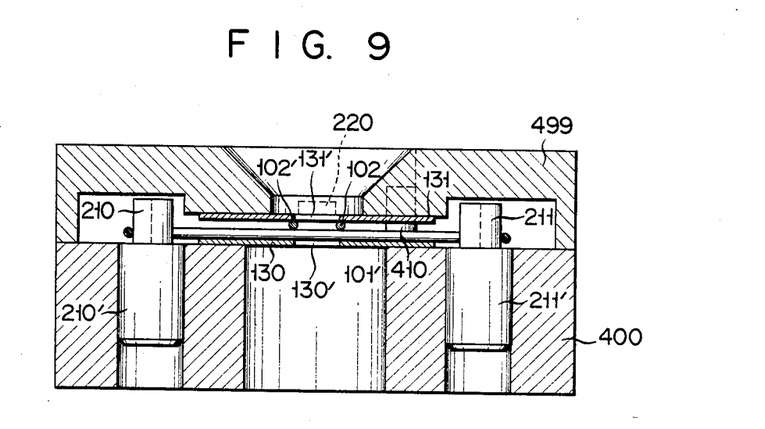
FIG. 9 is a sectional view taken along line IX—IX of FIG. 8.

Referring now to FIGS. 8 to 14, an embodiment of an aperture for the charged beam exposure apparatus will be described. In FIGS. 8 and 9, fine gold wires 101, 101', 102 and 102' defining the edges of an aperture structure are cylindrical and have a smooth surface with roughness of 0.1 microns or less. These fine gold wires are commercially available. In the electron optical system of 1/10 to 1/20 demagnification factor, the roughness of 0.1 micron or less is demagnified to 0.01 micron or less, and exerts no influence on the pattern formation. Thus, edges with high linearity can be obtained by stretching the wires under high tension. The corners of the aperture structure are right-angled and have no roundness at all.

A square opening 100 is formed by arranging the fine gold wires 101, 101', 102 and 102' in parallel crosses under tension. In order to assemble the fine gold wires so that the square opening has high parallelism and high linearity, cylindrical pins 210, 211, 220 and 222 with an outside diameter equal to the length of the side of the square opening 100 are fixed on an aperture base 400, and the fine gold wires 101, 101', 102 and 102' are stretched along the outer peripheral surfaces of the facing pairs of cylindrical pins 210, 211, 220 and 221. Namely, one fine gold wire is passed around the cylindrical pins 210 and 211, while another fine gold wire is passed around the cylindrical pins 220 and 221. Thus, the parallel fine gold wires 101, 101', 102 and 102' are arranged. The cylindrical pins 210, 211, 220 and 221 can be accurately ground with a diameter error of 1 micron. The orthogonality of the square opening 100 depends on the positioning accuracy for the arrangement of the cylindrical pins 210, 211, 220 and 221 in the X and Y directions on the aperture base 400. In this arrangement, the pins 210 and 211 are aligned in the X direction, while the pins 220 and 221 are aligned in the Y direction. The positioning accuracy of each of the four cylindrical pins 210, 211, 220 and 221 is available at about 3 microns by the use of a high-accuracy jig borer as a machine tool. The cylindrical pins 210, 211, 220 and 221 are press-fitted in the aperture base 400. Numerals 210' and 211' designate press fit portions.

Wound around the cylindrical pins 210, 211, 220 and 221 and stretched tight, the fine gold wires 101, 101', 102 and 102' are fixed at each end on the aperture base 400. Numerals 111, 111', 112 and 112' designate fixed portions consisting of silver solder or an adhesive agent.

If a square opening of 200 microns square are formed by means of the fine gold wires 101, 101', 102 and 102' and with a space of 10 mm kept between the cylindrical pins 210 and 211 or between the pins 220 and 221, the parallelism between the fine gold wires 101 and 101' or between the fine gold wires 102 and 102' is 1 micron, that is, the diameter error of the cylindrical pins. Since the cylindrical pins 210, 211, 220 and 221 are arranged with positioning accuracy of 3 microns, the angular error is within ±0.3 millirad (3 microns/10 millimeters), and the orthogonality is 90°±1'. Thus, in the square opening of 200 microns square, the parallelism and orthogonality between the fine gold wires are 0.02 microns/200 microns and 90°±1', respectively.

In FIGS. 8 and 9, numerals 130 and 131 designate molybdenum sheets for intercepting that portion of a beam which is applied to the other area than the square opening 100 defined by the fine gold wires 101, 101', 102 and 102'. The molybdenum sheets 130 and 131 have square openings 130' and 131', respectively, which are a little wider than the square opening 100. The molybdenum sheet 130 is fixed to the aperture base 400 before the assembling of the fine gold wires 101, 101', 102 and 102'. The molybdenum sheet 130 is positioned through the engagement of knock pins 410 and 411 on the aperture base 400 and positioning holes 420 and 421 in the molybdenum sheet 130. The molybdenum sheet 131 is interposed between the fine gold wires 101, 101', 102 and 102' and a cover 499 to protect the fine gold wires. The molybdenum sheet 131 is positioned in the same manner as the molybdenum sheet 130, using the same knock pins 410 and 411.

The cover 499 is fixed to the aperture base 400 by means of a clamp screw 510. Like the molybdenum sheets 130 and 131, the cover 499 is positioned on the aperture base 400 through the medium of the knock pins 410 and 411.

Thus, in the embodiment described above, the fine gold wires 101, 101', 102 and 102' are sandwiched between the molybdenum sheets 130 and 131 on both lower and upper sides. Alternatively, the molybdenum sheet may be provided on only one side of the fine gold wires. In the aforementioned embodiment, moreover, the fine gold wires 101, 101', 102 and 102' are fixed at each end on the aperture base 400. In order to prevent dislocation or slackening of the fine gold wires 101, 101', 102 and 102' at the time of the assembling of the molybdenum sheets 130 and 131 and the cover 499, the fine gold wires may be fixed to the lower molybdenum sheet 130 or the cylindrical pins 210, 211, 220 and 221 by means of an adhesive agent. The cylindrical pins as the standard means for the formation of the square opening 100 may be replaced with square pins.

In the electron optical system, the aperture base 400 is set in the positions for the aperture structures 13 and 14 shown in FIG. 1. The difference in level between the square edges, which is attributed to the thickness of the fine gold wires 101, 101', 102 and 102' arranged in parallel crosses, constitutes no hindrance to the beam formation.

Thus, in attaching the aperture base 400 to the electron optical system to form a shaped beam for pattern drawing, if the demagnification factor of the electron optical system is 1/20, then the roughness of the edges of a resultant square beam image of 10 microns square is 0.01 micron or less, the corners of the pattern have no roundness, and the parallelism of the sides of the square is ±0.001 micron/10 microns or less. In this manner, a shaped beam with high geometrical accuracy can be formed.

Considering the strength, the fine gold wires defining the square require a diameter of at least 20 microns or thereabouts. However, the aperture can be formed by the use of tungsten wire or glass fiber with a diameter of over 10 microns. The glass fiber is covered with gold for electrical conduction.

Figure 10:
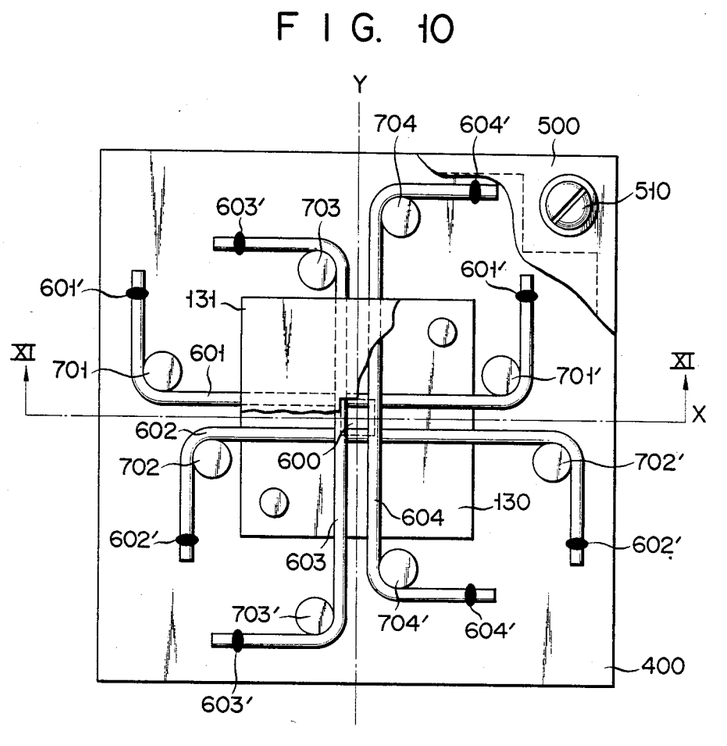
FIG. 10 is a plan view of another means for forming the aperture structure of the invention.
Figure 11:
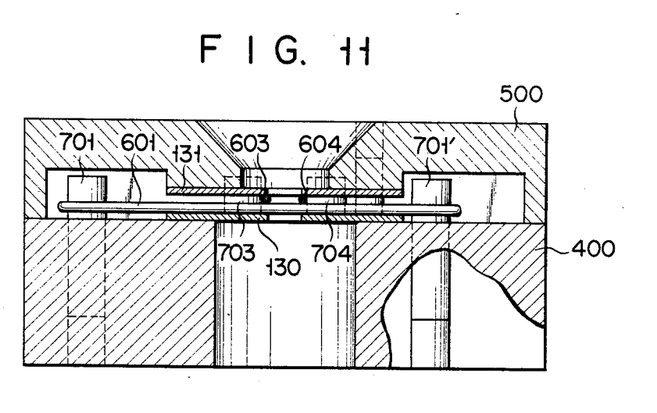
FIG. 11 is a sectional view taken along line XI—XI of FIG. 10.

Another embodiment of this invention will now be described in detail. In the aperture shown in FIG. 10, the square opening is so small (e.g., 100 microns square or less) that it is impossible to make cylindrical pins which are the same size as the square opening. In FIGS. 10 and 11, like reference numerals are used to designate the same portions as shown in FIGS. 8 and 9.

In this case, cylindrical pins 701, 701', 702, 702', 703, 703', 704 and 704' as standard means for the formation of a square opening 600 are arranged on the aperture base 400. The cylindrical pins 701, 701', 702 and 702' are arranged in the X direction; the cylindrical pins 703, 703', 704 and 704' in the Y direction. These cylindrical pins are press-fitted in the aperture base 400. In this pin arrangement, the cylindrical pins 701, 701', 703 and 703' are spaced from the pins 702, 702', 704 and 704', respectively, at a distance equal to the length of the side of the square opening 600 to be formed plus the respective diameters of two fine gold wires. Segments individually connecting the centers of the pins 701 and 701' and those of the pins 702 and 702' are parallel. Likewise, segments individually connecting the centers of the pins 703 and 703' and those of the pins 704 and 704' are parallel. At the same time, the pin arrangement line in the X direction is naturally at right angles to the arrangement line in the Y direction. The cylindrical pins 701, 701', 702, 702', 703, 703', 704 and 704' have the same size.

Fine gold wires 601, 602, 603 and 604 are stretched along the pairs of cylindrical pins 701 and 701', 702 and 702', 703 and 703', and 704 and 704', respectively, to form parallel crosses which define the square opening 600. The fine gold wires 601 to 604 are fixed at each end by an adhesive agent. Numerals 601', 602', 603' and 604' designate bonded portions.

As in the embodiment shown in FIG. 8, the arrangement of the cylindrical pins 701, 701', 702, 702', 703, 703', 704 and 704' ensures positioning accuracy of 3 microns. Thus, if a square opening of 40 microns square is formed with the pairs of cylindrical pins 701 and 701', 702 and 702', 703 and 703', and 704 and 704' arranged at intervals of 10 mm, the parallelism between the fine gold wires is about ±0.012 microns/40 microns, ensuring high geometrical accuracy.

In the embodiment shown in FIG. 8, all of the cylindrical pins as the standard means for the formation of the square opening have the same size as that of the square opening, since the square opening has high parallelism and orthogonality. On the other hand, the parallelism and orthogonality of the fine gold wires defining the square opening may be changed by using cylindrical pins of different diameters on eccentric pins.

Figure 12:
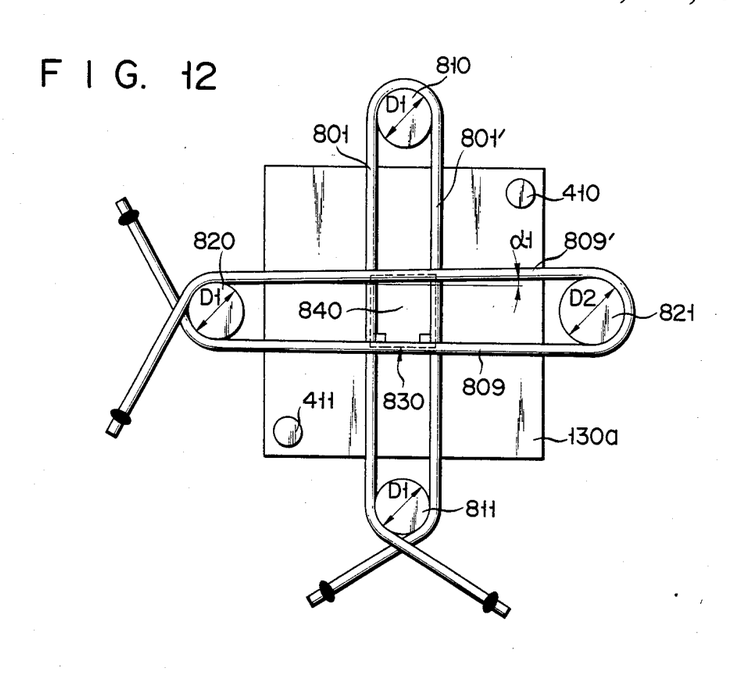
FIGS. 12 to 14 are plan views of the principal parts of a further means for forming the aperture structure of the invention which can form charged particle beams of various shapes.

FIG. 12 shows an embodiment in which one side of a fine gold wire defining a square opening is slanted by the use of cylindrical pins of different diameters. In FIG. 12 numerals 810, 811 and 820 designate cylindrical pins of one diameter D1, while numeral 821 denotes a cylindrical pin of another diameter D2 which is greater than the diameter D1. Alternatively, the cylindrical pin 821 may have a diameter smaller than the diameter D1. Fine gold wire sections 801 and 801' are stretched parallel around the cylindrical pins 810 and 811 of the same diameter D1. The center of the cylindrical pin 821 is dislocated for the difference between the radii of the cylindrical pins of the different diameters, i.e., $D2/2 - D1/2$, so that a fine gold wire section 809 extends at right angles to the fine gold wire sections 801 and 801'. As a result, a fine gold wire section 809' is inclined at an angle to the fine gold wire section 809, corresponding to the difference between the two pin diameters, i.e., $D2 - D1$. Accordingly, in forming a square opening 840 with a side length of D1 with the cylindrical pins 820 and 821 arranged at a distance $l$ from each other, the orthogonality of two angles formed individually between the fine gold wire sections 801 and 809' and between the fine gold wire sections 801' and 809 can be changed to an angle $\alpha 1$ (tan $\alpha 1 = (D2 - D1)/l$). Since the fine gold wires in the embodiment shown in FIG. 8 can be stretched with the parallelism of 1 microns/10 millimeters and orthogonality of $90° \pm 1'$, error for the angular change $\alpha$ is within ±1'. In FIG. 12, numeral 130a designates a molybdenum sheet. A square opening 830 formed in the molybdenum sheet 130a has the same figure of the square opening 840, and is a little greater in size than the opening 840. Thus, the square opening 830 intercepts that portion of a beam which passes through the square opening 840 defined by the fine gold wire sections 801, 801', 809 and 809'. Numerals 410 and 411 designate knock pins for positioning the molybdenum sheet 130a.

Thus, in exposing a square pattern using the aperture of the embodiment shown in FIG. 8, a change, if any, of the orthogonality of the pattern attributed to an image distortion caused by astigmatism can be measured. Thereupon, the pattern can be corrected by oppositely tilting in the measured angular adjustment, that side or sides of the square opening, which correspond to the affected side or sides of the pattern.

Figure 13:
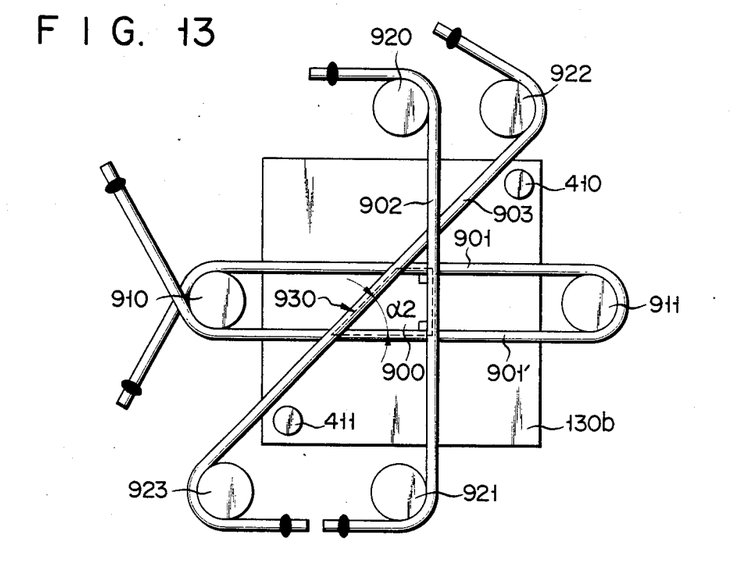

FIG. 13 shows an embodiment in which one of fine gold wires is diagonally stretched to form a trapezoidal opening. Two parallel fine gold wire sections 901 and 901' are stretched between cylindrical pins 910 and 911 of the same diameter. A fine gold wire 902 is stretched between cylindrical pins 920 and 921 at right angles to the fine gold wire sections 901 and 901', while another fine gold wire 903 is stretched between cylindrical pins 922 and 923 at an angle $\alpha 2$ (=45°) to the fine gold wire section 901'. Depending on the arrangement accuracy of the cylindrical pins 910, 911, 922 and 923, the angle α2 is subject to an error within ±1'. Thus, a trapezoidal opening 900 with the angle α2 accurately at 45° can be defined by the fine gold wires 901, 902 and 903. Numeral 130b designates a molybdenum sheet which has a trapezoidal opening 930 a little greater than the trapezoidal opening 900 defined by the fine gold wires 901, 901', 902 and 903.

Although the angle α2 is defined as 45° in this embodiment, it may be any other angle wider than 0° and narrower than 180°.

In exposing a pattern with an oblique side, the oblique side portion of the pattern is conventionally resolved into strips. With the arrangement of this embodiment, however, the oblique side portion can be constructed without being resolved. For example, an aperture having an oblique side may be set in the electron optical system as shown in FIG. 1 to form a shaped beam with an oblique side.

Figure 14:
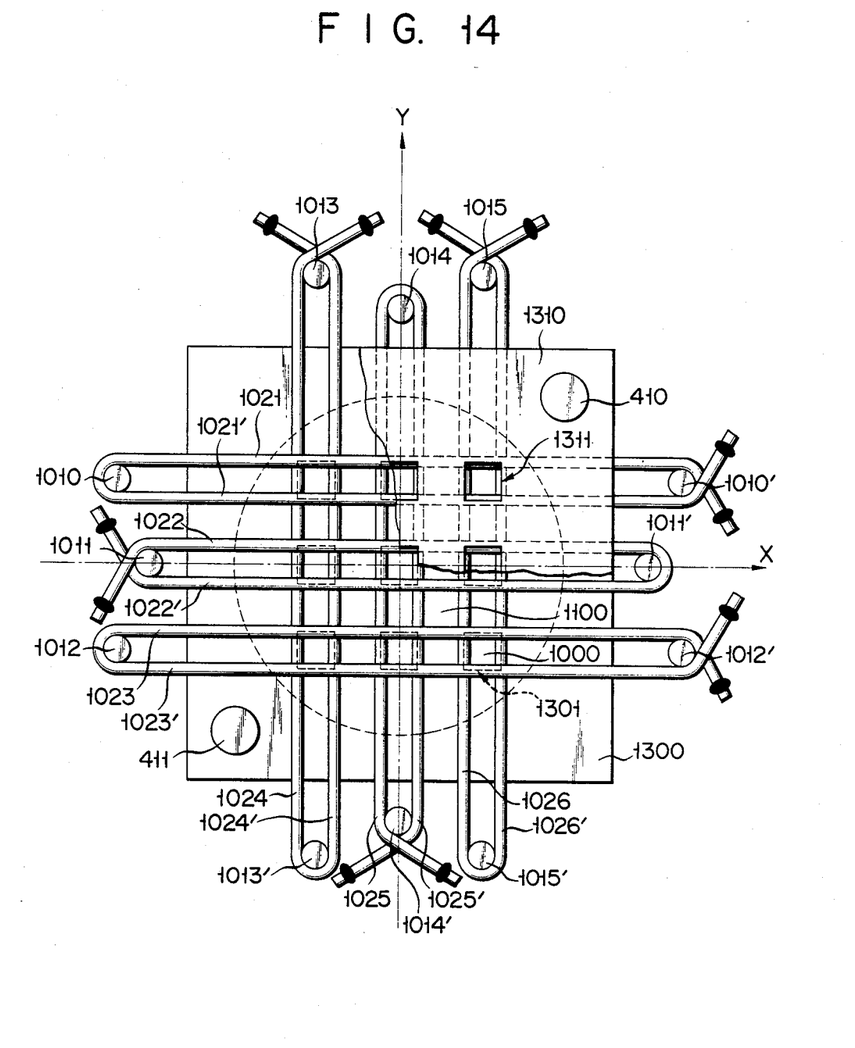

FIG. 14 shows an embodiment in which fine gold wires are stretched in meshes.

Cylindrical pins 1010, 1010', 1011, 1011', 1012, 1012', 1013, 1013', 1014, 1014', 1015 and 1015' having the same size of a plurality of square openings 1000 to be formed are arranged in X and Y directions on an aperture base 400 (not shown in FIG. 14). A fine gold wire is stretched around each pair of cylindrical pins so that a mesh is defined by a parallel pair of fine gold wire sections and another parallel pair of fine gold wire sections at right angles thereto. Namely, fine gold wire sections 1021 and 1021' are stretched between the cylindrical pins 1010 and 1010' arranged in the X direction; fine wire sections 1022 and 1022' between the pins 1011 and 1011', and fine wire sections 1023 and 1023' between the pins 1012 and 1012'. Likewise, fine gold wire sections 1024 and 1024' are stretched between the cylindrical pins 1013 and 1013' arranged in the Y direction; fine gold wire sections 1025 and 1025' between the pins 1014 and 1014', and fine gold wire sections 1026 and 1026' between the pins 1015 and 1015'. Since the diameter of a beam to be applied to the aperture in the electron optical system of FIG. 1 is about 500 microns, each two adjacent cylindrical pins are spaced at a distance of 500 microns or more lest the beam be applied to adjoining square openings to contaminate them or to be leaked. Numeral 1300 designates a molybdenum sheet disposed under the fine gold wires for intercepting that portion of a beam which is applied to the other region than the square openings 1000 defined by the fine gold wires. Thus, the molybdenum sheet 1300 has square openings 1301 which are a little greater than the square openings 1300 defined by the fine gold wires and are as numerous as the same. Numeral 1310 designates a molybdenum sheet which is disposed over the fine gold wires and has square openings 1311 similar to the openings 1301. The molybdenum sheet 1310 not only intercepts the excluded portion of the beam, but also protects the fine gold wires. The molybdenum sheets 1300 and 1310 are relatively positioned by means of positioning knock pins 410 and 411 arranged on the aperture base 400 (not shown in FIG. 14).

In the embodiment described above, the side of each square opening 1000 is defined by the diameter of the cylindrical pins. Alternatively, a square opening may be defined by a square section 1100 whose side length is determined by the space between the cylindrical pins arranged in the X and Y directions. Considering the diameter of the beam applied to the aperture structure, square openings defined by using pins of the same diameter and ones defined by the intervals between the pins may be formed on one and the same aperture, spaced so that the beam should not be applied to adjoining square openings. Thus, square openings of different dimensions may be formed as required.

With this arrangement, if one square opening is contaminated after prolonged use, then another can be used instead. Thus, it is possible to reduce those troublesome operations for maintenance, such as replacement and cleaning of the aperture, alignment of the beam after replacement, etc. Since the square openings are subject to no variations in parallelism and orthogonality and are oriented accurately, the alignment of the beam can readily be achieved by only moving the aperture in the X and Y directions without changing the alignment conditions of the electron optical system.

This invention is not limited to the above described embodiments. For example, the fine wires may be formed from any one of several materials other than gold, including platinum, silver, tungsten, gilded tungsten and gilded glass fiber. The conductive sheets may be formed from any one of numerous materials other than molybdenum, including titanium, tungsten, stainless steel, copper, aluminum, gold, and gilded versions of molybdenum, titanium, tungsten, stainless steel, copper and aluminum. Moreover, the aperture base may be formed from any one of a number of other materials including titanium, stainless steel, copper, phosphor bronze, brass, beryllium copper, aluminum, aluminum alloy, and gilded ceramics.

Furthermore, various modifications may be made without departing from the scope of the present invention.

What is caimed is:

1. An aperture structure for a charged particle beam exposure apparatus which includes an electron optical system having an optical axis, said aperture structure comprising:

an electrically conductive sheet having an opening therein, said opening havinq straight edges;

a base having a plurality of pins projecting therefrom, said base being disposed on said optical axis of said electron optical system of said charged particle beam exposure apparatus and having an opening therein opposed to said opening of said conductive sheet for passing a charged beam therethrough; and fine wires stretched between respective pins of said base, said fine wires having side edges which are individually located inside at least two adjacent sides of the opening of the conductive sheet, said fine wires defining an opening smaller than the opening of the conductive sheet, said opening defined by said fine wires defining the cross-section of the charged particle beam;

said electrically conductive sheet being disposed adjacent at least one side of said fine wires;

said opening of said conductive sheet being a polygonal opening one corner of which is right-angled; and said plurality of pins being located so that the fine wires thereon define the sides of the aperture corresponding to the individual sides of said polygonal opening of said conductive sheet.

2. The aperture structure of claim 1, wherein said opening of said electrically conductive sheet has two adjacent sides intersecting at right angles, and wherein said plurality of pins comprises two pairs of pins opposed to one another with said opening of said conductive sheet being in the center of the area defined by said pins, so that two parallel sections of each fine wire define each of two opposite sides of said opening of said conductive sheet.

3. The aperture structure of claim 2, wherein said opening of said electrically conductive sheet is a square opening.

4. The aperture structure of claim 2, wherein each of said pins has a diameter shorter than the length of each side of said opening of said electrically conductive sheet.

5. The aperture structure of claim 3, wherein said plurality of pins comprises four pairs of pins which are so arranged that the fine wires stretched therebetween define individual sides of said square opening of said electrically conductive sheet.

6. The aperture structure of claim 1, wherein said opening of said electrically sheet is a square opening having two right-angled corners, and wherein at least one of said plurality of pins is different in diameter from the others of said pins, so that a fine wire wound thereon defines one side of said square opening inclined at an angle to another side of said square opening.

7. The aperture structure of claim 1, wherein said electrically conductive sheet is interposed between said base and said fine wires.

8. The aperture structure of claim 1, wherein said electrically conductive sheet is arranged on the side of said fine wires remote from said base.

9. The aperture structure of claim 1, comprising two of said electrically conductive sheets having said openings therein, one of said electrically conductive sheets being interposed between said fine wires and said base, and the other of said electrically conductive sheets being arranged on the side of said fine wires remote from said base, whereby said fine wires are sandwiched between said electrically conductive sheets.

10. The aperture structure of claim 1, wherein said electrically conductive sheet is located on said fine wires in contact therewith.

11. The aperture structure of claim 1, wherein said fine wires are spaced from said base, and wherein said electrically conductive sheet is interposed between said fine wires and said base so as to fill in said space therebetween.

12. The aperture structure of claim 1, wherein said fine wires are formed from a material selected from the group consisting of gold platinum, silver, tungsten, gilded tungsten and gilded glass fiber.

13. The aperture structure of claim 1, wherein said conductive sheet is formed from a material selected from the group consisting of molybdenum, titanium, tungsten, stainless steel, copper, aluminum, gold, and gilded versions of molybdenum, titanium, tungsten, stainless steel, copper and aluminum.

14. The aperture structure of claim 1, wherein said base is formed from a material selected from the group consisting of titanium, stainless, steel, copper, phosphor bronze, brass, beryllium copper, aluminum, aluminum alloy and gilded ceramics.

15. An aperture structure for a charged particle beam exposure apparatus which includes an electron optical system having an optical axis, said aperture structure comprising:

an electrically conductive sheet having an opening therein, said opening having straight edges;

a base having a plurality of pins projecting therefrom, said base being disposed on said optical axis of said electron optical system of said charged particle beam exposure apparatus and having an opening therein opposed to said opening of said conductive sheet for passing a charged particle beam therethrough; and fine wires stretched between respective pins of said base, said fine wires having side edges which are individually located inside at least two adjacent sides of the opening of the conductive sheet, said fine wires defining an opening smaller than the opening of the conductive sheet, said opening defined by said fine wires defining the cross-section of the charged particle beam;

said electrically conductive sheet being disposed adjacent at least one side of said fine wires;

said opening of said conductive sheet comprising a plurality of square openings arranged in at least one row; and said fine wires being stretched between selected ones of said plurality of pins so as to define respective square openings smaller than said square openings of said conductive sheet so that each fine wire section defines corresponding sides of the square openings in each row of said square openings.

16. The aperture structure of claim 15, wherein said electrically conductive sheet is interposed between said base and said fine wires.

17. The aperture structure of claim 15, wherein said electrically conductive sheet is arranged on the side of said fine wires remote from said base.

18. The aperture structure of claim 15, comprising two of said electrically conductive sheets having said openings therein, one of said electrically conductive sheets being interposed between said fine wires and said base, and the other of said electrically conductive sheets being arranged on the side of said fine wires remote from said base, whereby said fine wires are sandwiched between said electrically conductive sheets.

19. The aperture structure of claim 15, wherein said electrically conductive sheet is located on said fine wires in contact therewith.

20. The aperture structure of claim 15, wherein said fine wires are spaced from said base, and wherein said electrically conductive sheet is interposed between said fine wires and said base so as to fill in said space therebetween.

21. The aperture structure of claim 15, wherein said fine wires are formed from a material selected from the group consisting of gold, platinum, silver, tungsten, gilded tungsten and gilded glass fiber.

22. The aperture structure or claim 15, wherein said conductive sheet is formed from a material selected from the group consisting of molybdenum, titanium, tungsten, stainless steel, copper, aluminum, gold, and gilded versions of molybdenum, titanium, tungsten, stainless steel, copper and aluminum.

23. The aperture structure of claim 15, wherein said base is formed from a material selected from the group consisting of titanium, stainless, steel, copper, phosphor bronze, brass, beryllium copper, aluminum, aluminum alloy and gilded ceramics.

24. An aperture structure for a charged particle beam exposure apparatus which includes an election optical system having an optical axis, said aperture structure comprising:

an electronically conductive sheet having an opening therein, said opening having straight edges;

fine wires arranged adjacent straight edges of said opening of said electrically conductive sheet, said fine wires having side edges which are individually located inside at least two adjacent sides of the opening of the conductive sheet, said fine wires defining an opening smaller than the opening of the conductive sheet, said opening defined by said fine wires defining the cross-section of the charged particle beam;

said electrically conductive sheet being disposed adjacent at least one side of said fine wires; and winding means for supporting each of said fine wires at each end thereof, said winding means being arranged for winding said fine wires so that the aperture forming portion of said fine wires can be renewed by fresh portions of said fine wires.

25. The aperture structure of claim 24, further comprising:

a base disposed on said optical axis of said electron optical system, and having an opening therein opposed to said opening of said conductive sheet for passing a charged particle beam therethrough;

said winding means being mounted on said base.

26. The aperture structure of claim 25, further comprising guide pins on said base between edges of said opening of said electrically conductive sheet and said respective winding means for guiding and positioning said fine wires relative to said opening of said electrically conductive sheet.

27. The aperture structure of claim 25, wherein said electrically conductive sheet is located on said fine wires in contact therewith.

28. The aperture structure of claim 25, wherein said fine wires are spaced from said base and wherein said electrically conductive sheet is interposed between said fine wires and said base so as to fill in said space therebetween.

* * * * *